United States Patent
Morioka et al.

(10) Patent No.: US 7,098,489 B2
(45) Date of Patent: Aug. 29, 2006

(54) SPLIT TYPE LIGHT RECEIVING ELEMENT AND CIRCUIT-BUILT-IN LIGHT-RECEIVING ELEMENT AND OPTICAL DISK DRIVE

(75) Inventors: Tatsuya Morioka, Ikoma (JP); Shigeki Hayashida, Nara (JP); Yoshihiko Tani, Tenri (JP); Isamu Ohkubo, Kashiba (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/483,493

(22) PCT Filed: Jul. 3, 2002

(86) PCT No.: PCT/JP02/06707

§ 371 (c)(1),
(2), (4) Date: Jan. 12, 2004

(87) PCT Pub. No.: WO03/009397

PCT Pub. Date: Jan. 30, 2003

(65) Prior Publication Data

US 2004/0169247 A1    Sep. 2, 2004

(30) Foreign Application Priority Data

Jul. 12, 2001  (JP)  ............... 2001-212291
May 14, 2002  (JP)  ............... 2002-138460

(51) Int. Cl.
*H01L 29/205*  (2006.01)

(52) U.S. Cl. .............. 257/186; 257/184; 257/292; 257/461

(58) Field of Classification Search ........... 257/79–88, 257/186, 184, 292, 461
See application file for complete search history.

(56) References Cited

U.S. PATENT DOCUMENTS

| 5,811,842 | A | * | 9/1998 | Funaba | 257/186 |
| 5,880,494 | A | | 3/1999 | Watanabe | |
| 6,147,390 | A | * | 11/2000 | Nakano et al. | 257/437 |
| 6,348,720 | B1 | * | 2/2002 | Okada | 257/437 |
| 6,376,871 | B1 | | 4/2002 | Arai | |
| 6,448,104 | B1 | | 9/2002 | Watanabe | |
| 6,492,702 | B1 | | 12/2002 | Fukushima et al. | |
| 6,713,756 | B1 | * | 3/2004 | Ymamoto et al. | |

FOREIGN PATENT DOCUMENTS

| EP | 0778621 A2 | 6/1997 |
| EP | 0911881 A3 | 4/1999 |
| JP | 9-213920 A | 8/1997 |
| JP | 9-283787 A | 10/1997 |
| JP | 9-289333 A | 11/1997 |
| JP | 10-125974 A | 5/1998 |
| JP | 11-177138 A | 7/1999 |
| JP | 11-307753 A | 11/1999 |
| JP | 2001-60713 A | 3/2001 |
| JP | 2001-148503 A | 5/2001 |
| JP | 2001-284629 A | 10/2001 |

* cited by examiner

*Primary Examiner*—Fetsum Abraham
(74) *Attorney, Agent, or Firm*—Birch, Stewart, Kolasch & Birch, LLP

(57) ABSTRACT

A plurality of N-type diffusion layers are formed a specified distance apart on a P-type semiconductor layer. A P-type leak prevention layer formed between at least N-type diffusion layers prevents leaking between the diffusion layers. A dielectric film is formed in at least a light incident area on a P-type semiconductor layer including the diffusion layers and the leak prevention layer. Accordingly, provided are a split type light receiving element positively functioning as a split type light receiving element even when charge is accumulated in the dielectric film and having a uniform sensitivity throughout the entire area on a light receiving surface, and a circuit-built-in light receiving element and an optical disk device using the split type light receiving element.

12 Claims, 15 Drawing Sheets

WAVELENGTH: 400nm
ABSORPTION COEFFICIENT: 50000cm$^{-1}$

SPLIT TYPE LIGHT RECEIVING ELEMENT AND CIRCUIT-BUILT-IN LIGHT-RECEIVING ELEMENT AND OPTICAL DISK DRIVE

TECHNICAL FIELD

The present invention relates to segmented type light-receiving devices, circuit-integrated type light-receiving devices and optical disk apparatuses and relates, in particular, to a segmented type light-receiving device for use in a signal processing section of an optical disk apparatus for a high-density DVD (Digital Versatile Disc) employing a light source of a short wavelength or the like as well as a circuit-integrated type light-receiving device and an optical disk apparatus.

BACKGROUND ART

Conventionally, an optical pickup section used in an optical disk apparatus has an optical construction in which semiconductor laser light is concentrated on and applied to a disk by a lens, reflected light has its light intensity modulated according to the signal written on the disk and this reflected light is further made incident on a light-receiving device (or a circuit-integrated type light-receiving device in which the light-receiving device and a transistor for processing an electric signal taken out of this light-receiving device are integrated on an identical substrate). This light-receiving device (or the circuit-integrated type light-receiving device) employed in this optical pickup section also detects a focus signal and a servo signal according to the shapes of a plurality of light rays applied to and reflected on the disk besides the detection of the data signal written on the disk. Then, control is executed so that light is accurately applied to the disk, in which the data signal is written, on the basis of the detected focus signal and servo signal.

Then, the optical pickup section employs a segmented type light-receiving device constructed of a plurality of pn junctions that can receive a plurality of light rays (refer to Japanese Laid-open Publication No. H9-213920). A dielectric film is formed on the light-receiving device surface, on which light is incident, of the segmented type light-receiving device in order to control the reflectance on the device surface. When a single-layer oxide film is employed as this dielectric film construction, a condition of $\lambda/4n$ (n represents the refractive index of the oxide film, and $\lambda$ represents the wavelength of light) of an optimum film thickness is satisfied, and the oxide film thickness is 70 nm with respect to, for example, light of a wavelength of 400 nm. Moreover, a multilayer structure, which has a low reflectance with respect to the wavelength to be used, is also employed as the aforementioned dielectric film construction.

As shown in FIG. 20, in the case where, for example, two light-receiving sections are formed by providing n-type semiconductor layers 901 and 902 on a p-type semiconductor layer 900 (there is shown none of the electrode leads, the interlayer films and so on of the n-type semiconductor layer and the p-type semiconductor layer), electric charges are accumulated in a dielectric film 903. Therefore, an N-type inversion layer 904 is formed by the inversion of the conductive type in the surface of the p-type semiconductor layer 900, and the two light-receiving sections are disadvantageously connected together by this n-type inversion layer 904. Consequently, there is a problem that signals cannot be individually taken out of the two light-receiving sections and the device does not function as a segmented type light-receiving device. The problem of the segmented type light-receiving device easily occurs particularly when the concentration of the p-type semiconductor layer on which the n-type semiconductor layer is provided is reduced to improve the frequency characteristic determined by a CR time constant by reducing the capacitance of the pn junction of the segmented type light-receiving device.

DISCLOSURE OF THE INVENTION

Accordingly, the object of the present invention is to provide a segmented type light-receiving device that reliably functions as a segmented type light-receiving device even if electric charges are accumulated in the dielectric film and provide a circuit-integrated type light-receiving device and an optical disk apparatus that employ the segmented type light-receiving device.

In order to achieve the above object, there is provided a segmented type light-receiving device comprising:

a plurality of second conductive type diffusion layers formed spaced apart at prescribed intervals on a first conductive type semiconductor layer;

a leakage prevention layer that is formed at least between the plurality of second conductive type diffusion layers on the first conductive type semiconductor layer and prevents leakage between the plurality of second conductive type diffusion layers; and a dielectric film that is formed at least in a region on which light is incident on the first conductive type semiconductor layer including the plurality of second conductive type diffusion layers and the leakage prevention layer.

According to the segmented type light-receiving device of the above-mentioned construction, leakage can be prevented from occurring so that the surface of the first conductive type semiconductor layer is not inverted to the n-type of the second conductive type and the plurality of second conductive type diffusion layers are not connected together by virtue of the formation of the leakage prevention layer formed between at least the plurality of second conductive type diffusion layers on the first conductive type semiconductor layer in the region other than the region in which the plurality of second conductive type diffusion layers are formed even on condition that the surface of the first conductive type semiconductor layer is inverted to the second conductive type by the influence of electric charges due to the dielectric film that serves as the antireflection film. Therefore, the device reliably functions as a segmented type light-receiving device even if electric charges are accumulated in the dielectric film.

In one embodiment of the present invention, the first conductive type semiconductor layer is exposed between the plurality of second conductive type diffusion layers and the first conductive type leakage prevention layer.

According to the segmented type light-receiving device of the above-mentioned embodiment, the first conductive type semiconductor layer is exposed between the plurality of second conductive type diffusion layers and the first conductive type leakage prevention layer. Therefore, the leakage between the plurality of second conductive type diffusion layers can be reduced, and the withstand voltage across the leakage prevention layer and the second conductive type diffusion layers can be improved.

In one embodiment of the present invention, assuming that the dielectric film has a film thickness d1 [nm] and the leakage prevention layer has a surface concentration C1 [$cm^{-3}$], then the film thickness d1 of the dielectric film and the surface concentration C1 of the leakage prevention layer are set so as to satisfy the condition of:

$$d1 \times \sqrt{C1} \geq 1 \times 10^{10}.$$

According to the segmented type light-receiving device of the above-mentioned embodiment, even when the film thickness of the dielectric film is optimized for the optimization of the reflectance of the dielectric film, a satisfactory leakage prevention layer can be formed by satisfying the above-mentioned condition.

In one embodiment of the present invention, assuming that the leakage prevention layer has a width W1 [cm] and the leakage prevention layer has a surface concentration C1 [cm$^{-3}$], then the width W1 and the surface concentration C1 of the leakage prevention layer are set so as to satisfy the condition of:

$$C1 \leq 2.0 \times 10^{19}$$

when W1 > $4 \times 10^{-5}$ cm and satisfy the condition of:

$$C1 \leq 1.0 \times 10^{20} \times \text{Exp}(-4 \times 10^4 \times W1)$$

when W1 $\geq 4 \times 10^{-5}$ cm.

According to the segmented type light-receiving device of the above-mentioned embodiment, there can be obtained a segmented type light-receiving device that has a uniform sensitivity characteristic in the whole region of the light-receiving surface including the portion on the leakage prevention layer.

Also, there is provided a segmented type light-receiving device comprising:

a plurality of second conductive type first diffusion layers formed spaced apart at prescribed intervals on a first conductive type semiconductor layer;

a first conductive type second diffusion layer formed at least between the plurality of second conductive type first diffusion layers on the first conductive type semiconductor layer; and a dielectric film that is formed at least in a region on which light is incident on the first conductive type semiconductor layer including the plurality of second conductive type first diffusion layers and the first conductive type second diffusion layer, the plurality of second conductive type first diffusion layers and the first conductive type second diffusion layer having a layer thickness equal to or greater than an absorption length of short-wavelength light.

According to the segmented type light-receiving device of the above-mentioned construction, leakage can be prevented from occurring so that the surface of the first conductive type semiconductor layer is not inverted to the second conductive type and the plurality of second conductive type first diffusion layers are not connected together by virtue of the formation of the first conductive type second diffusion layer formed between at least the plurality of second conductive type first diffusion layers on the first conductive type semiconductor layer in the region other than the region in which the plurality of second conductive type first diffusion layers are formed even on condition that the surface of the first conductive type semiconductor layer is inverted to the second conductive type by the influence of electric charges due to the dielectric film that serves as the antireflection film. Furthermore, the plurality of second conductive type first diffusion layers and the first conductive type second diffusion layer have a layer thickness equal to or greater than the absorption length of light of a short wavelength (for example, wavelength is 350 to 450 nm). Therefore, the device has an excellent characteristic to the short-wavelength light and reliably functions as a segmented type light-receiving device even if electric charges are accumulated in the dielectric film.

In one embodiment of the present invention, the first conductive type semiconductor layer is exposed between the plurality of second conductive type first diffusion layers and the first conductive type second diffusion layer.

According to the segmented type light-receiving device of the above-mentioned embodiment, the first conductive type semiconductor layer is exposed between the plurality of second conductive type first diffusion layers and the first conductive type second diffusion layer. Therefore, the leakage between the plurality of second conductive type first diffusion layers can be reduced, and the withstand voltage across the second conductive type first diffusion layer and the first conductive type second diffusion layer can be improved.

In one embodiment of the present invention, assuming that the dielectric film has a film thickness d1 [nm] and the first conductive type second diffusion layer has a surface concentration C2 [cm$^{-3}$], then the film thickness d1 of the dielectric film and the surface concentration C2 of the first conductive type second diffusion layer are set so as to satisfy the condition of:

$$d2 \times \sqrt{C2} \geq 1 \times 10^{10}.$$

According to the segmented type light-receiving device of the above-mentioned embodiment, even when the film thickness of the dielectric film is optimized for the optimization of the reflectance of the dielectric film, there can be formed the first conductive type second diffusion layer that has a satisfactory leakage prevention function by satisfying the aforementioned condition.

In one embodiment of the present invention, assuming that the first conductive type second diffusion layer has a width W2 [cm] and the first conductive type second diffusion layer has a surface concentration C2 [cm$^{-3}$], then the width W2 and the surface concentration C2 of the second diffusion layer are set so as to satisfy the condition of:

$$C2 \leq 2.0 \times 10^{19}$$

when W2 < $4 \times 10^{-5}$ cm and satisfy the condition of:

$$C2 \leq 1.0 \times 10^{20} \times \text{Exp}(-4 \times 10^4 \times W2)$$

when W2 $\geq 4 \times 10^{-5}$ cm.

According to the segmented type light-receiving device of the above-mentioned embodiment, there can be obtained a segmented type light-receiving device that has a uniform sensitivity characteristic with respect to the short-wavelength light in the whole region of the light-receiving surface including the first conductive type second diffusion layer region.

In one embodiment of the present invention, the dielectric film is comprised of a structure in which one or a plurality of oxide films and one or a plurality of nitride films are alternately laminated, the films totally constituting at least three layers.

According to the segmented type light-receiving device of the above-mentioned embodiment, reflectance can be reduced, and the surface concentration of the leakage prevention layer can be reduced. Therefore, sensitivity can be kept satisfactory.

Also, there is provided a circuit-integrated type light-receiving device, wherein the above-mentioned segmented type light-receiving device and a signal processing circuit for processing a signal outputted from the segmented type light-receiving device are formed on an identical semiconductor substrate.

According to the circuit-integrated type light-receiving device of the above-mentioned construction, there can be obtained a circuit-integrated type light-receiving device of a satisfactory sensitivity characteristic.

Also, there is provided an optical disk apparatus employing the above-mentioned segmented type light-receiving device.

Also, there is provided an optical disk apparatus employing the above-mentioned circuit-integrated type light-receiving device.

According to the optical disk apparatus of the above-mentioned construction, there can be provided an optical disk apparatus that employs the segmented type light-receiving device or the circuit-integrated type light-receiving device having a satisfactory sensitivity characteristic in the optical pickup section.

BEST MODE FOR CARRYING OUT THE INVENTION

Figure 1:
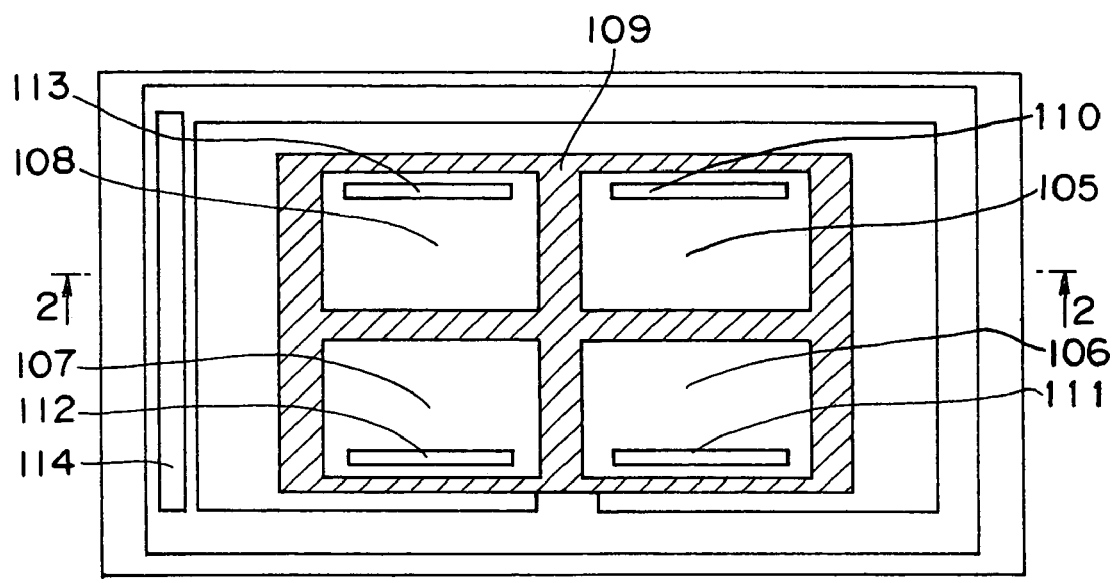
FIG. 1 is a plan view showing the planar structure of a segmented type light-receiving device of a first embodiment of this invention.

The segmented type light-receiving device, circuit-integrated type light-receiving device and optical disk apparatus of this invention will be described in detail below on the basis of the embodiments thereof shown in the drawings.

FIRST EMBODIMENT

Figure 2:
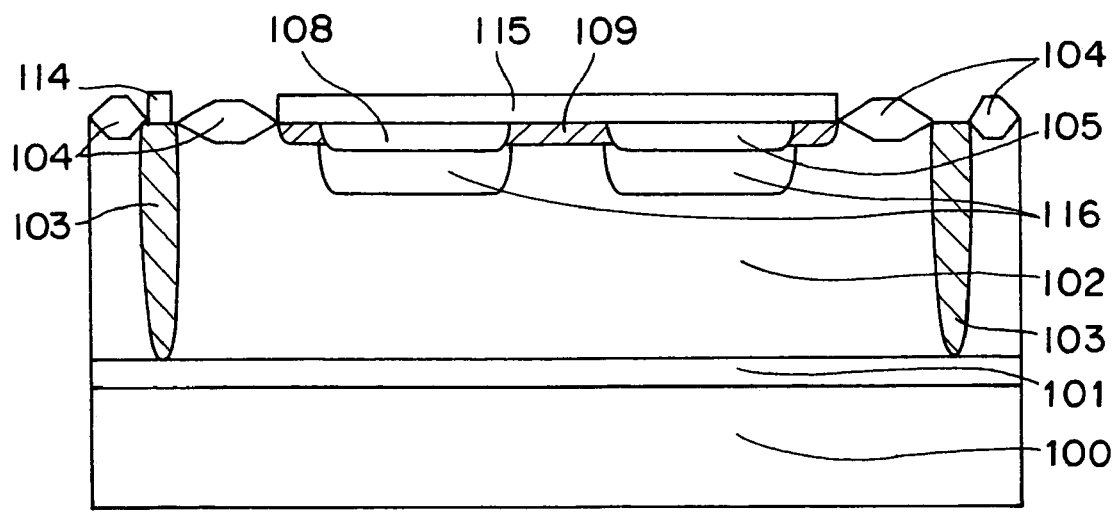
FIG. 2 is a sectional view taken along the line 2—2 of FIG. 1.

FIG. 1 is a plan view showing the planar structure of the segmented type light-receiving device of the first embodiment of this invention, and FIG. 2 is a sectional view taken along the line 2—2 of FIG. 1. In the segmented type light-receiving device of this first embodiment, the structure (for example, multilayer interconnections, interlayer films and so on) formed subsequent to the metal interconnection processing step is not shown. Moreover, the dielectric film 115 shown in FIG. 2 is not shown in FIG. 1 for the sake of easiness in viewing the figure.

As shown in FIGS. 1 and 2, a first p-type semiconductor layer 101 that has a thickness of 1 μm and a boron concentration of $1 \times 10^{18}$ cm$^{-3}$ is formed on a p-type semiconductor substrate 100 (for example, silicon substrate) that has a boron concentration of $1 \times 10^{15}$ cm$^{-3}$. A second p-type semiconductor layer 102 as a first conductive type semiconductor layer that has, for example, a thickness of 14 to 16 μm and a boron concentration of about $1 \times 10^{14}$ to $1 \times 10^{15}$ cm$^{-3}$ is formed on the first p-type semiconductor layer 101. A third p-type semiconductor layer 103 for anode contact formation is formed downwardly from the surface of the thus formed second p-type semiconductor layer 102. A LOCOS region 104 for element isolation is formed on the surface of the second p-type semiconductor layer 102.

Further, n-type diffusion layers 105, 106, 107 and 108 as second conductive type diffusion layers that have, for example, an arsenic concentration of about $1 \times 10^{19}$ to $1 \times 10^{20}$ cm$^{-3}$ and a junction depth of about 0.1 to 0.8 μm are formed spaced apart at prescribed intervals on the surface of the second p-type semiconductor layer 102. Cathode electrodes 110, 111, 112 and 113 for current takeout are provided on the n-type diffusion layers 105, 106, 107 and 108, respectively.

Further, a p-type leakage prevention layer 109 that has a boron concentration of about $1 \times 10^{19}$ cm$^{-3}$ is formed around the n-type diffusion layers 105, 106, 107 and 108. This p-type leakage prevention layer 109 is connected to the third p-type semiconductor layer 103 for anode contact formation, and an anode electrode 114 is formed for current takeout on the device surface. Then, a dielectric film 115 (for example, oxide film) for preventing light from being reflected on the surface is formed to a film thickness of 70 nm in the region to which light is applied on the second p-type semiconductor layer 102.

The structure of the aforementioned segmented type light-receiving device will be described more in detail below.

Depletion layers 116 are formed in the p-type semiconductor layer 102 by pn junctions formed of the n-type diffusion layers 105 through 108 provided on the second p-type semiconductor layer 102. Electrons generated in the depletion layers 116 by light applied to this region flow through the n-type diffusion layers 105 through 108 and are taken out of the cathode electrodes (110, 111, 112 and 113 shown in FIG. 1). Conversely, holes generated in the depletion layers 116 flow through the second p-type semiconductor layer 102 and are taken out of the anode electrode 114. For example, when light is applied onto the n-type diffusion layer 105, a photocurrent is taken out of the cathode electrode 110 and the anode electrode 114. Likewise, when light is applied to the other n-type diffusion layers 106, 107 and 108, a photocurrent is taken out of the cathode electrodes 111, 112 and 113 corresponding to the n-type diffusion layers 106, 107 and 108, respectively, and the anode electrode 114. The quantity of light applied to the segmented type light-receiving device can be thus estimated.

Figure 3A:
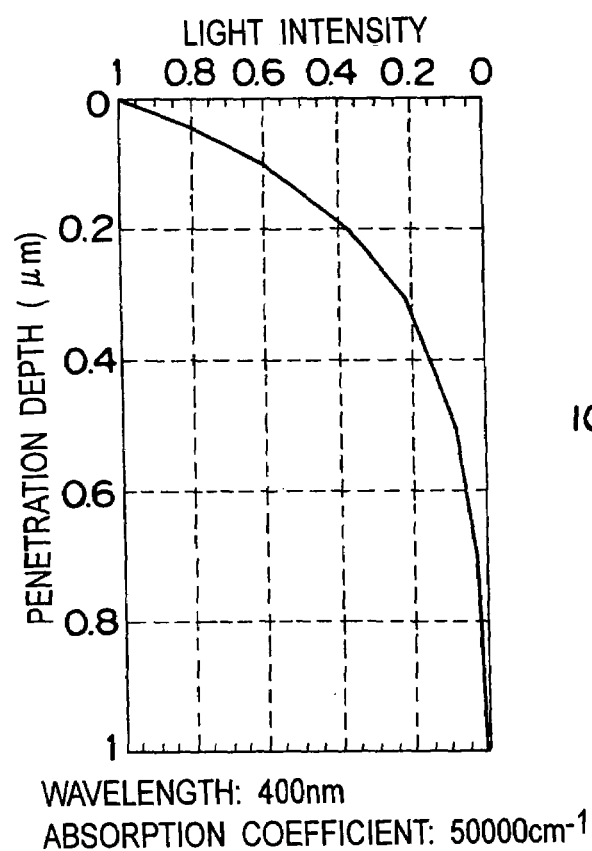
FIG. 3A is a graph showing the relation between the light intensity and the penetration depth of the above segmented type light-receiving device.
Figure 3B:
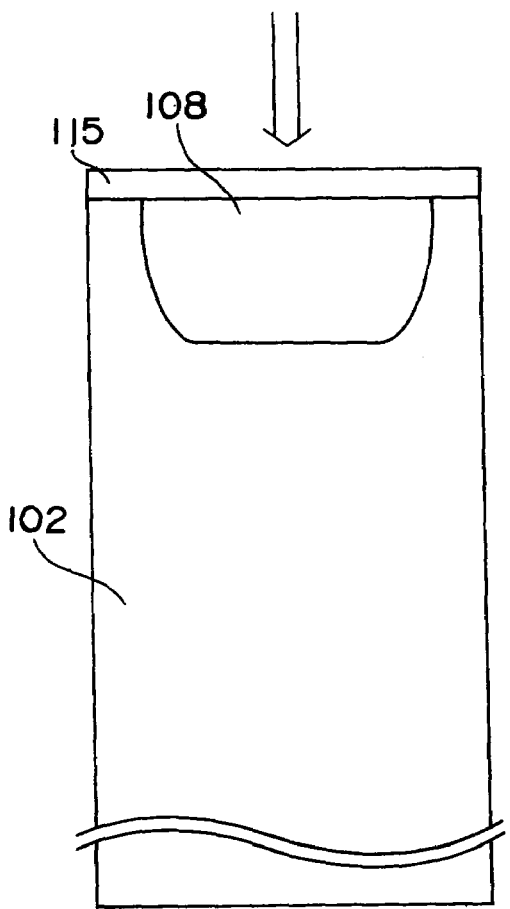
FIG. 3B is a cross-sectional structural view of the above segmented type light-receiving device.

It is preferred that light is wholly absorbed in the depletion layers 116 formed of the pn junctions formed by the n-type diffusion layers 105 through 108. FIG. 3A shows the degree of absorption of light that has a wavelength of about 400 nm incident on the silicon with respect to a penetration depth, and FIG. 3B shows a sectional view of the device. In FIG. 3A, the horizontal axis represents the light intensity, while the vertical axis represents the penetration depth (μm). As is apparent from FIGS. 3A and 3B, the absorption length becomes about 0.2 μm at a wavelength of 400 nm (absorption coefficient is about 50000 cm$^{-1}$). That is, assuming that the light intensity is I, the intensity of incident light is $I_0$, the absorption coefficient is α and the penetration depth is d, then the light intensity I is expressed as:

$$I = I_0 \times \exp^{-\alpha d}$$

and, since the absorption length of light is the penetration depth when the intensity $I_0$ of the incident light becomes 1/e (≈3.67), the penetration depth d, i.e., the absorption length satisfies the equation:

$$-\alpha d = -1$$

wherein the absorption coefficient a is about 50000 cm$^{-1}$, absorption length of about 0.2 μm is obtained. Therefore, the film thickness of the n-type diffusion layers 105 through 108 should preferably be set to about 0.2 to 1 μm.

Moreover, as shown in FIGS. 1 and 2, the p-type leakage prevention layer 109 doped more highly than the second p-type semiconductor layer 102 is formed in the regions other than the n-type semiconductor layer 102. Consequently, in the regions other than the regions in which the n-type diffusion layers 105 through 108 are formed, no inversion to the n-type occurs by virtue of the formation of the p-type leakage prevention layer 109 of a high surface concentration even on condition that the surface of the second p-type semiconductor layer 102 is inverted to the n-type by the influence of electric charges due to the dielectric film 115 that serves as the antireflection film, making it possible to restrain the problem that the n-type diffusion layers are connected together to fail in functioning as a segmented type light-receiving device.

Moreover, the depletion layers 116 formed in the second p-type semiconductor layer 102 by the n-type diffusion layers 105 through 108 and the second p-type semiconductor layer 102 are scarcely influenced by this p-type leakage prevention layer 109, and there occurs only an increase in the capacitance component due to the comparatively highly doped n-type semiconductor layer and the p-type leakage prevention layer. Consequently, a junction capacitance formed in this region can be made roughly equivalent to the case where this p-type leakage prevention layer 109 is not provided even when the concentration of the second p-type semiconductor layer 102 is reduced, and the frequency characteristic of the device determined by a CR time constant can be kept satisfactory.

Furthermore, since the p-type leakage prevention layer 109 is formed of the p-type diffusion layer, there can also be obtained the effect that, even when light is applied to the region of this leakage prevention layer 109, this portion has a satisfactory sensitivity characteristic.

The function of the leakage prevention layer of the segmented type light-receiving device of this invention can be applied to the device in which the p-type and n-type conductive types of this first embodiment are exchanged.

Moreover, although arsenic is employed as the impurity of the n-type diffusion layer, it is acceptable to employ another impurity such as phosphorus. Although boron is employed as the impurity of the p-type diffusion layer, it is acceptable to employ another impurity such as indium.

Moreover, the concentration, layer thickness and so on of the second p-type semiconductor layer 102 are not limited to those described in connection with this first embodiment.

Moreover, the arrangement, configurations and so on of the anode electrode and the cathode electrode are not limited to those described in connection with this first embodiment. Moreover, although this first embodiment is based on the case of the quadrisected segmented type light-receiving device, the leakage prevention layer described in this invention can be applied also to a bisected or another segmented type light-receiving device of another segmented configuration.

SECOND EMBODIMENT

Figure 4:
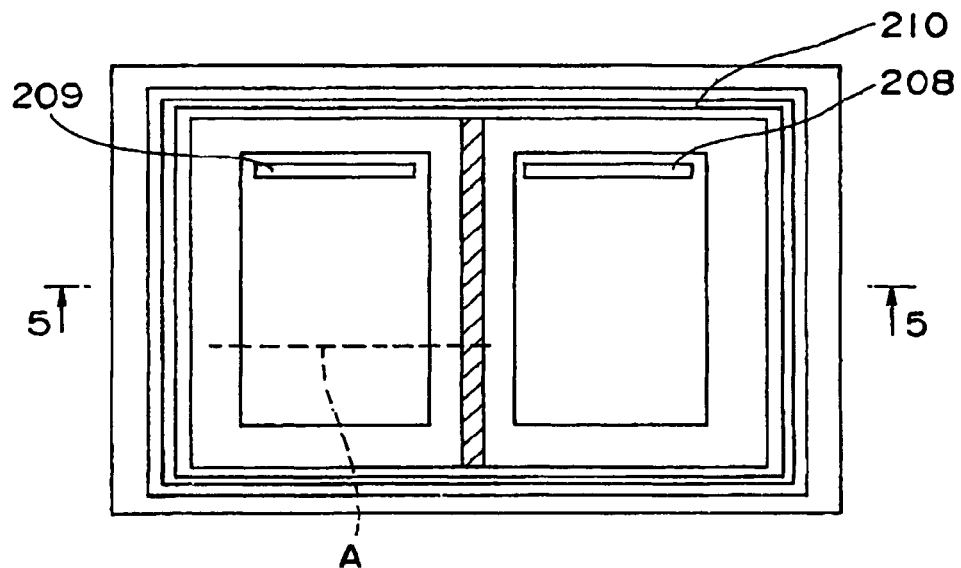
FIG. 4 is a plan view showing the planar structure of a segmented type light-receiving device of a second embodiment of this invention.
Figure 5:
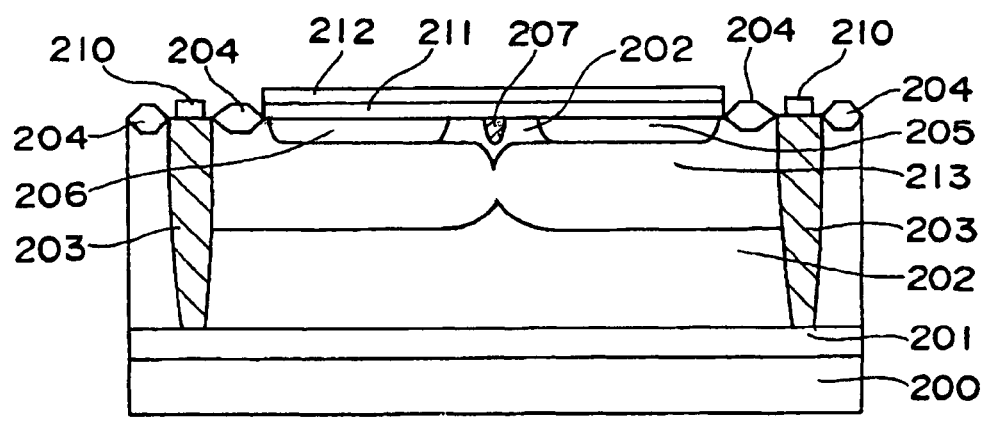
FIG. 5 is a sectional view taken along the line 5—5 of FIG. 1.

FIG. 4 is a plan view showing the planar structure of the segmented type light-receiving device of the second embodiment of this invention, and FIG. 5 is a sectional view taken along the line 5—5 in FIG. 4. In the segmented type light-receiving device of this second embodiment, the structure (for example, multilayer interconnections, interlayer films and so on) formed subsequent to the metal interconnection processing step is not shown.

As shown in FIGS. 4 and 5, a first p-type semiconductor layer 201 that has a thickness of 1 μm and a boron concentration of $1 \times 10^{18}$ cm$^{-3}$ is formed on a p-type semiconductor substrate 200 (for example, silicon substrate) that has a boron concentration of $1 \times 10^{15}$ cm$^{-3}$. A second p-type semiconductor layer 202 that has, for example, a thickness of 14 to 16 μm and a boron concentration of about $1 \times 10^{14}$ to $1 \times 10^{15}$ cm$^{-3}$ is formed on the first p-type semiconductor layer 201. A third p-type semiconductor layer 203 for anode contact formation is formed downwardly from the surface of the thus formed second p-type semiconductor layer 202. A LOCOS region 204 for element isolation is formed on the surface of the second p-type semiconductor layer 202.

N-type diffusion layers 205 and 206 as second conductive type first diffusion layers that have, for example, an arsenic concentration of about $1\times10^{19}$ to $1\times10^{20}$ cm$^{-3}$ and a junction depth of about 0.1 to 0.8 μm are formed spaced apart at prescribed intervals on the surface of the second p-type semiconductor layer 202. Cathode electrodes 208 and 209 for current take out are provided on the n-type diffusion layers 205 and 206, respectively. Then, a p-type leakage prevention layer 207 as a first conductive type second diffusion layer that has, for example, a boron concentration of $5\times10^{18}$ cm$^{-3}$ and a junction depth of about 0.3 μm for preventing leakage is formed in a region located between the n-type diffusion layers 205 and 206.

Further, a dielectric film (oxide film) 211 and a dielectric film (nitride film) 212, which serve as an antireflection film, are formed at least in the region to which light is applied on the second p-type semiconductor layer 202. Further, an anode electrode 210 is formed on the third p-type semiconductor layer 203. The numeral 213 denotes a depletion layer.

Even with the above-mentioned structure, the n-type diffusion layers 205 and 206 are not connected together by virtue of the p-type leakage prevention layer 207 in the portion on the surface of which the second p-type semiconductor layer 202 is exposed even when inversion is caused by electric charges due to the dielectric films (211 and 212), and the device reliably functions as a segmented type light-receiving device.

Figure 6:
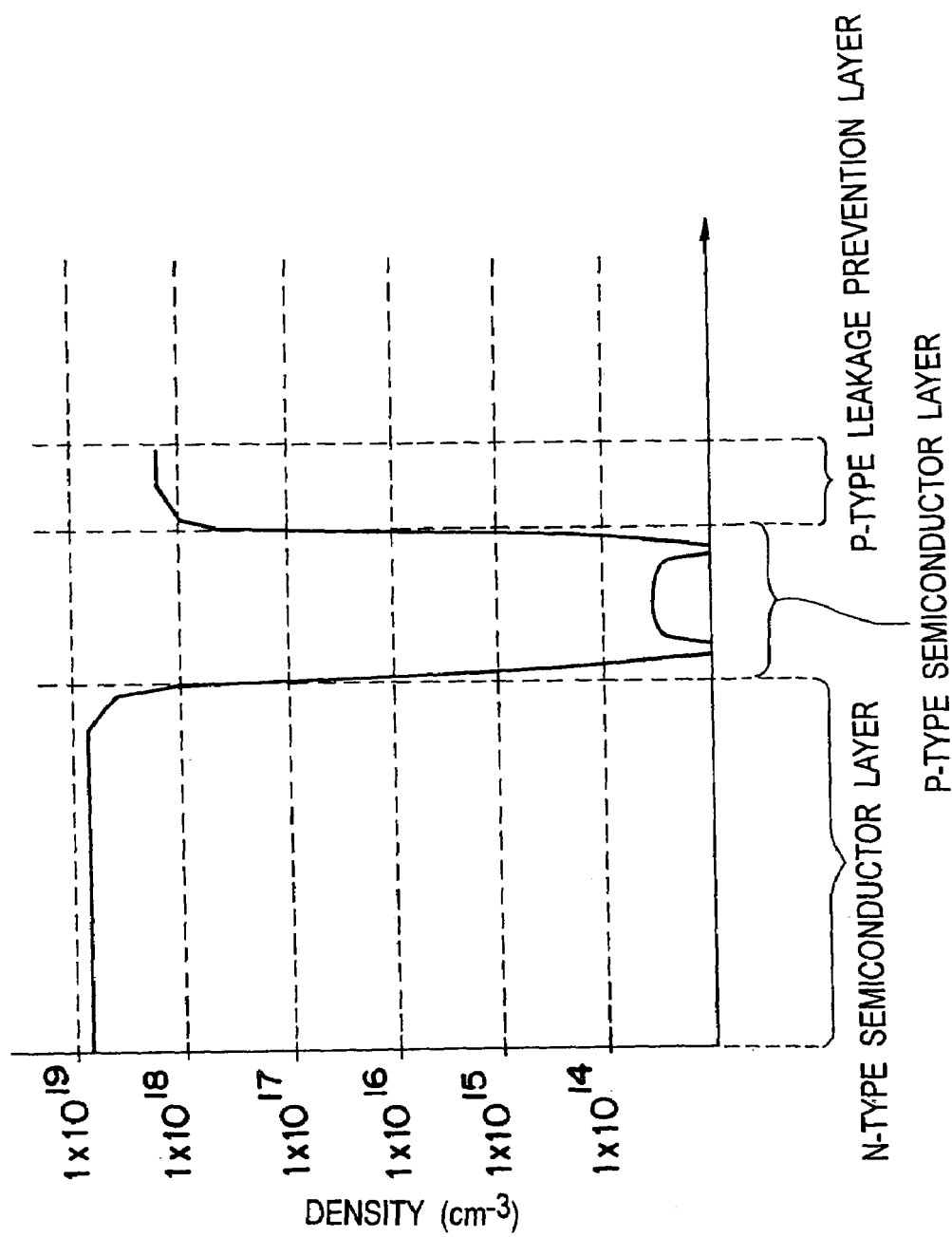
FIG. 6 is a graph showing the impurity concentration distribution of a segmented type light-receiving device.

FIG. 6 shows the arsenic and boron concentration profiles in a position of about 0.2 μm apart from the surface along the cross section of the dashed line A shown in FIG. 4 in the structure of the segmented type light-receiving device of the second embodiment. Since the second p-type semiconductor layer 202 is exposed between the n-type diffusion layer 205 and the p-type leakage prevention layer 207, leakage prevention and a withstand voltage across the n-type diffusion layer and the p-type leakage prevention layer can be improved by adopting the structure of this second embodiment in comparison with the case where the comparatively highly doped n-type semiconductor layer and the p-type diffusion layer that serves as the leakage prevention layer are put in contact with each other as described in connection with the first embodiment. Furthermore, since the comparatively highly doped layers of the opposite conductive types are not put in contact with each other, the junction capacitance in this portion is allowed to be reduced and made equivalent to the total capacitance of the whole device in which no p-type leakage prevention layer is provided, and the response characteristic of the device determined by the CR time constant can also be kept satisfactory.

In this second embodiment, the concentration, layer thickness and so on of each semiconductor layer are not limited to those described in connection with the second embodiment, and the p-type diffusion layer that serves as the p-type leakage prevention layer may be formed of $BF^2$ or the like.

Moreover, the constructions of the dielectric films (211 and 212) formed on the second p-type semiconductor layer 202 are not limited to those described in connection with the second embodiment but allowed to adopt various materials and constructions.

Moreover, the electrode structure, the shape and number of the light-receiving surface and so on are not limited to those described in connection with this second embodiment.

THIRD EMBODIMENT

The segmented type light-receiving device of the third embodiment of this invention will be described next. The layer structure of the segmented type light-receiving device of this third embodiment has the same construction as that of the segmented type light-receiving device of the second embodiment, and FIGS. 4 and 5 should be correspondingly referred to for the structure.

In the segmented type light-receiving device of this third embodiment, the film thickness of the dielectric films 211 and 212 provided on the second p-type semiconductor layer 202 is set so that incident light is efficiently made incident on the light-receiving device.

Figure 7:
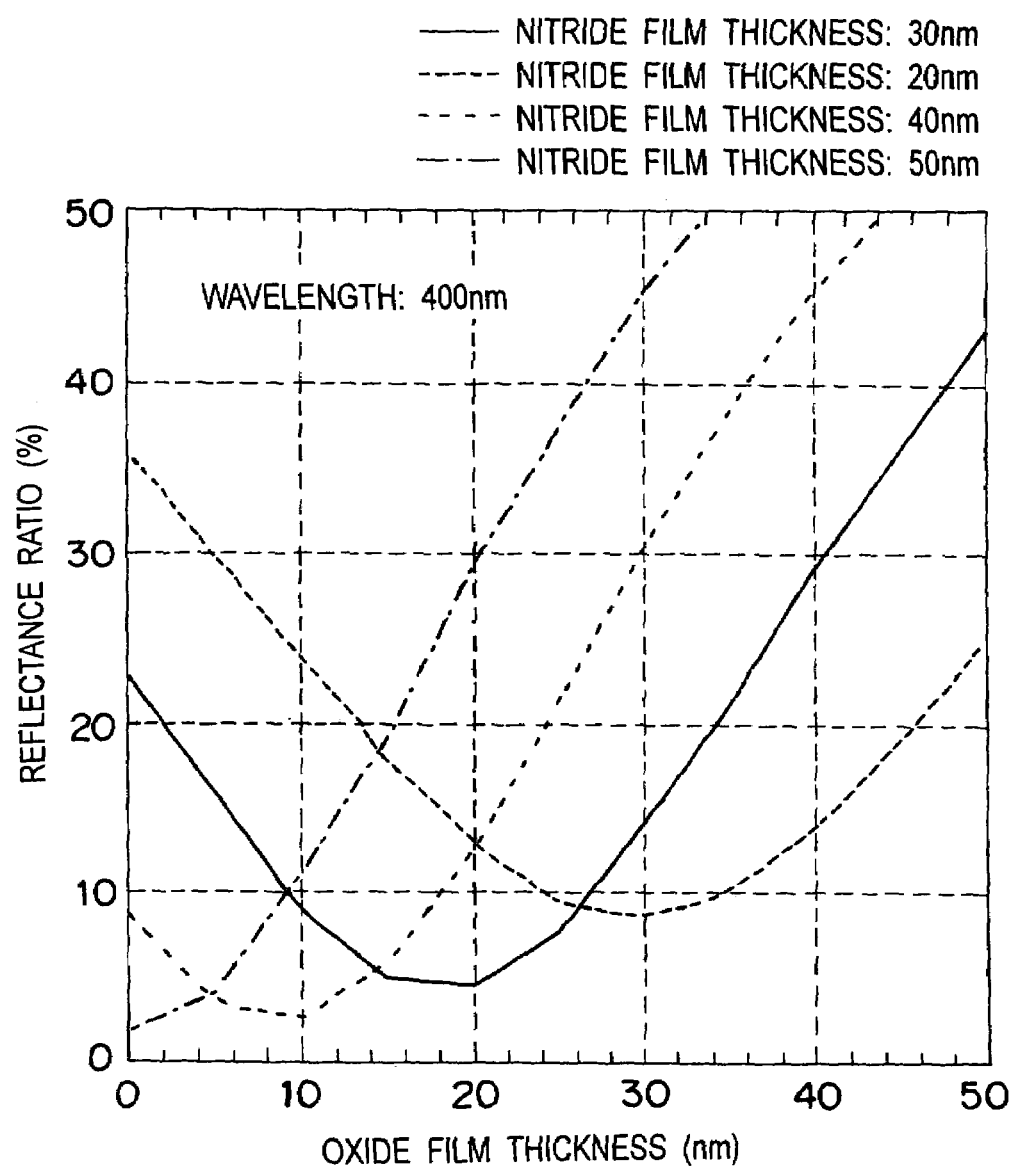
FIG. 7 is a graph showing the calculation results of reflectance with respect to the construction of the dielectric film that serves as the antireflection film of a segmented type light-receiving device of a third embodiment of this invention.

FIG. 7 shows the calculation results of surface reflectance when the film thickness of the dielectric film (oxide film) 211 is changed relative to the film thickness of the dielectric film (nitride film) 212 with respect to light of a wavelength of 400 nm. As is apparent from FIG. 7, it can be understood that the film thickness of the dielectric film (nitride film) 212 and the film thickness of the dielectric film (oxide film) 211 are required to be optimized in order to reduce the reflectance, and it is preferable to reduce the film thickness of the dielectric film (oxide film) 211 and increase the film thickness of the dielectric film (nitride film) 212 with respect to light of a wavelength of about 400 nm.

Figure 8:
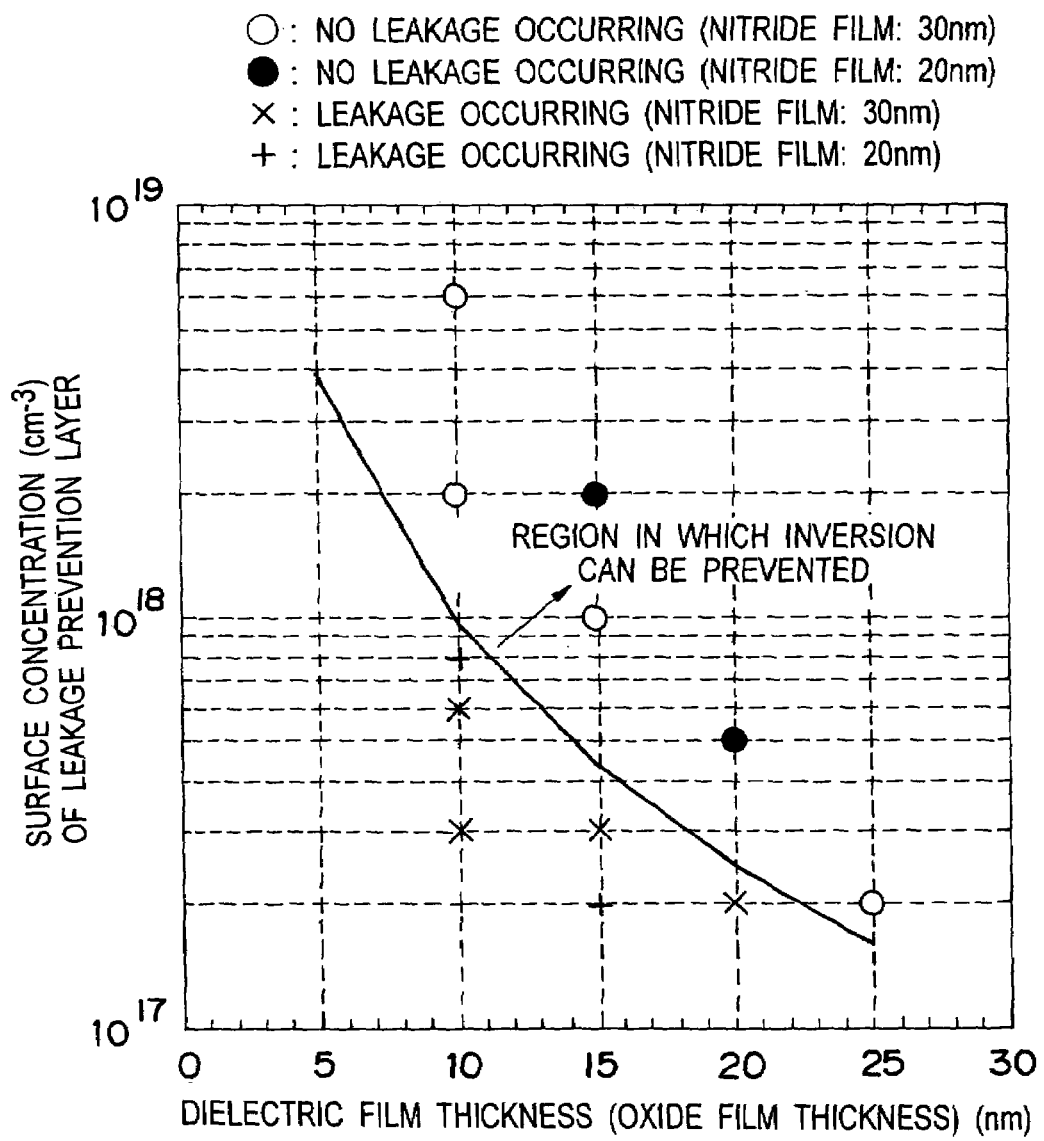
FIG. 8 is a graph showing the change in the surface concentration of boron in the leakage prevention layer with respect to the dielectric film thickness of the above segmented type light-receiving device.

FIG. 8 shows the results of measuring a leakage current between different cathodes when the surface concentration of boron in the p-type leakage prevention layer 207 is changed by changing this oxide film thickness in the device structure of the segmented type light-receiving device of this second embodiment. According to this result, it can be understood that the leakage current between the cathodes cannot be restrained as the film thickness of the dielectric film (oxide film) 211 is reduced in the case of the p-type leakage prevention layer 207 that has same surface concentration. The reason for the above is that electric charges are accumulated at the interface between the oxide film and the nitride film in the antireflection film, and when the electric charges are positive charges, electrons are accumulated on the surface of the p-type leakage prevention layer 207 to form an n-type inversion layer region, disadvantageously causing an electrical connection between the n-type diffusion layers 205 and 206 that serve as a plurality of cathodes.

In order to prevent this, the p-type leakage prevention layer 207 that has a prescribed surface concentration is provided. However, it has been discovered that an electric field intensity due to electric charges is increased when the film thickness of the dielectric film (oxide film) 211 is small even when the amount of charges accumulated at the dielectric interface is constant and the concentration of the p-type leakage prevention layer 207 is constant and the inversion of the second p-type semiconductor layer more easily occurs. Consequently, the n-type diffusion layers 205 and 206 are disadvantageously electrically connected together, and therefore, the surface concentration of the p-type leakage prevention layer 207 is required to be increased in order to prevent this.

As a result of examining this relation more in detail, it has been discovered that it is proper to set the relation between a surface concentration C1 [cm$^{-3}$] of the p-type diffusion layer that serves as the leakage prevention layer and the dielectric film thickness (oxide film thickness) d1 [nm] that serves as the antireflection film as:

$$d1 \times \sqrt{C1} \geq 1 \times 10^{10}.$$

For example, it is preferable to set the nitride film to 40 nm and set the oxide film to 10 nm in order to restrain the surface reflectance to 2.5%. In this case, the concentration of the p-type leakage prevention layer 207 is required to be set to $1\times10^{18}$ [cm$^{-3}$] or more.

With the above arrangement, the leakage between the n-type diffusion layers 205 and 206 that serve as the cathodes can be restrained, and the device reliably functions as a segmented type light-receiving device.

With regard to the effects of the segmented type light-receiving device of this third embodiment, the inversion of the conductive type occurs as a consequence of the accumulation of electric charges on the surface or in the vicinity of the surface of this oxide film even when the dielectric film that serves as the antireflection film is provided with a single-layer structure of an oxide film. Therefore, by setting the thickness of the dielectric film that satisfies the aforementioned relation, this problem can be restrained.

With regard to the conductive type of the structure described in connection with this third embodiment, similar effects can be obtained even when the n-type is changed to p-type and the p-type is changed to n-type.

FOURTH EMBODIMENT

The segmented type light-receiving device of the fourth embodiment of this invention will be described next. The segmented type light-receiving device of this fourth embodiment has the same construction as that of the segmented type light-receiving device of the second embodiment.

Figure 9:
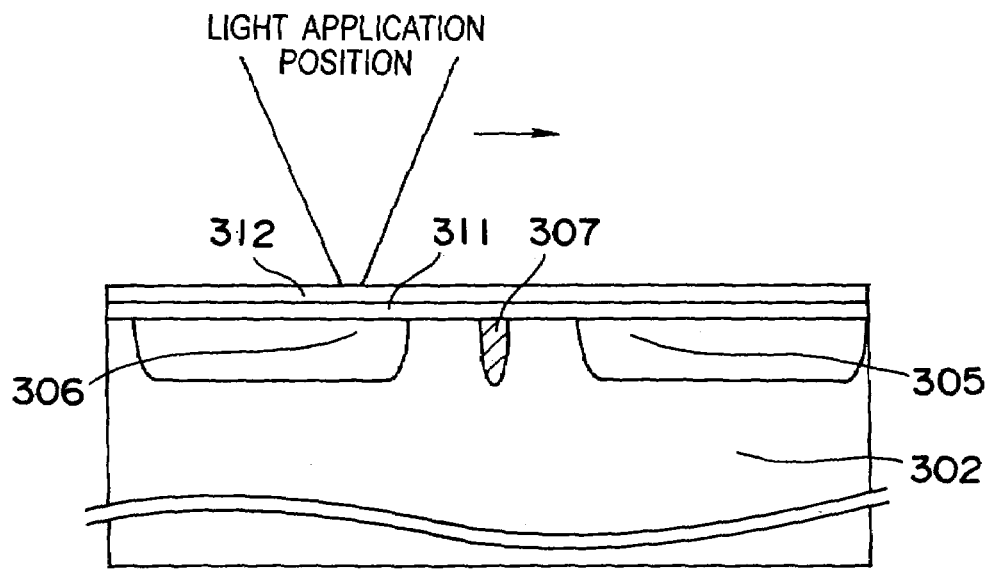
FIG. 9 is a cross-sectional structural view of a segmented type light-receiving device whose leakage prevention layer has a small width in a fourth embodiment of this invention.

As shown in FIG. 9, when light is applied to the region of n-type diffusion layers 305 and 306 as second conductive type first diffusion layer that serves as a cathode formed on a p-type semiconductor layer 302 (light is applied to 306 in FIG. 9), electrons generated in this region are taken out of cathode electrodes (not shown) provided on the n-type diffusion layers 305 and 306. In contrast to this, holes are taken out of an anode electrode (not shown) that is a p-type leakage prevention layer 307 as a first conductive type second diffusion layer located on the substrate side.

Figure 10:
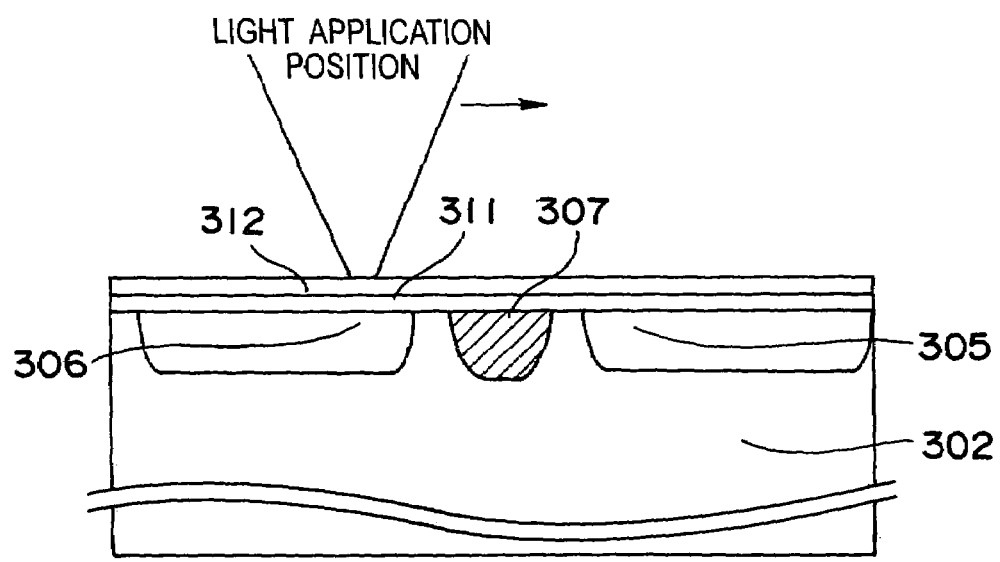
FIG. 10 is a cross-sectional structural view of a segmented type light-receiving device whose leakage prevention layer has a great width.
Figure 11:
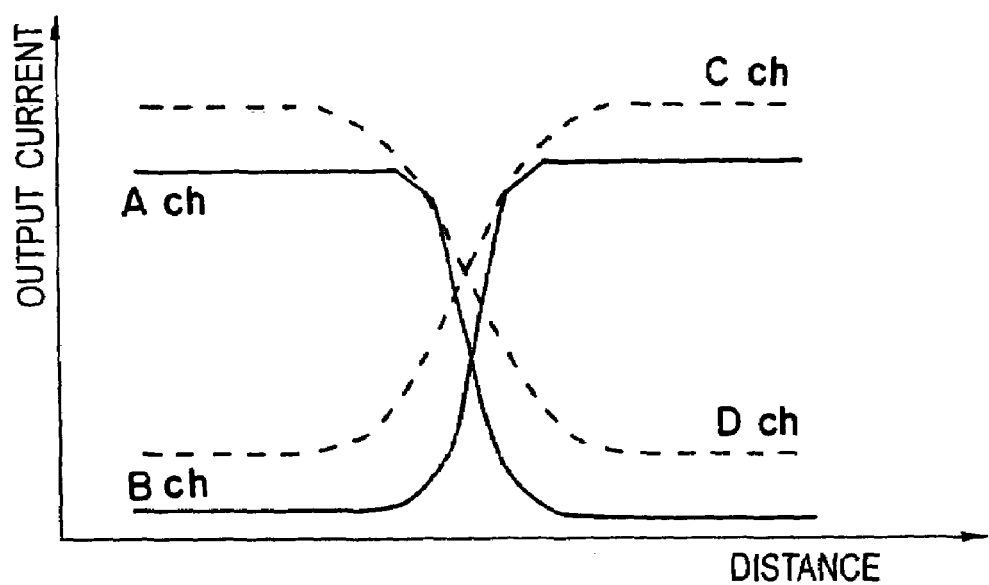
FIG. 11 is a graph showing the crosstalk characteristics of the structures of the segmented type light-receiving devices of FIGS. 9 and 10.

However, when light is applied to the region of the p-type leakage prevention layer 307, the generated electrons are taken out of each cathode electrode at an approximately equal rate. Consequently, when light is applied while being scanned, cathodic currents taken out of the cathode electrodes are varied depending on the width of the p-type leakage prevention layer 307. That is, the state in which the cathodic current is taken out changes depending on when the width of the p-type leakage prevention layer 307 is small as shown in FIG. 9 and when the width of the p-type leakage prevention layer 307 is great as shown in FIG. 10. FIG. 11 shows output characteristics (crosstalk characteristics) from the cathode electrodes when the light application position is scanned in the direction of arrow (from the left-hand side toward the right-hand side in the figure) in FIGS. 9 and 10. In FIG. 11, there are shown an output Ach of a cathode (306) and an output Bch of a cathode (305) of FIG. 9 as well as an output Cch of the cathode (306) and an output Dch of the cathode (305) of FIG. 10.

Figure 12:
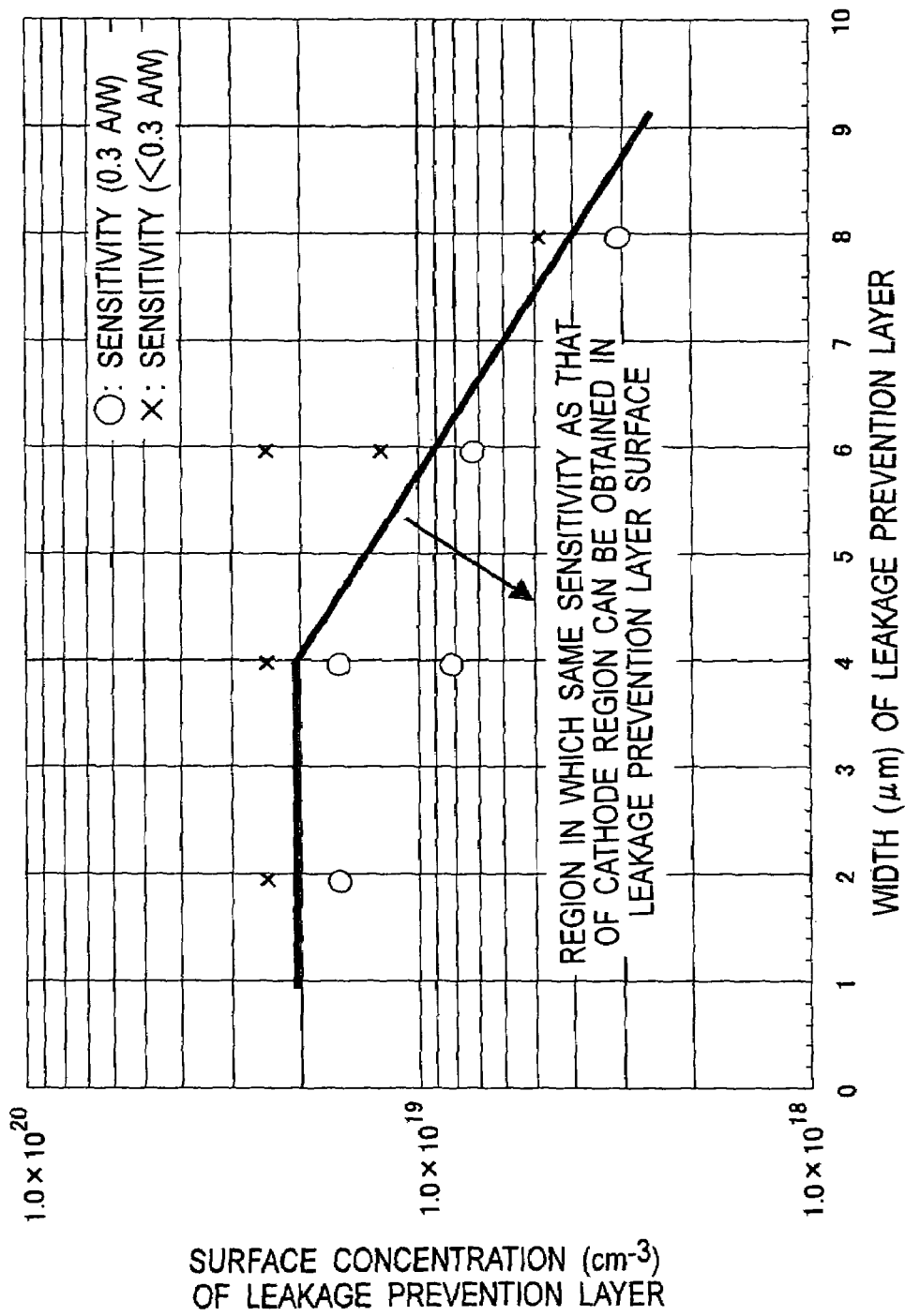
FIG. 12 is a graph showing the sensitivity characteristic with respect to the width and the surface concentration of boron in the leakage prevention layer of the above segmented type light-receiving device.

Due to the aforementioned characteristics possessed, it is required to optimize the width of the p-type leakage prevention layer 307 according to applications. FIG. 12 shows the results of measuring the sensitivity when the width and concentration of the p-type leakage prevention layer 307 are changed in this case. The sensitivity curve shown in this FIG. 12 shows a region that has the same sensitivity as that of the n-type semiconductor layer of the cathode region and has a uniform sensitivity characteristic in the surface of the light-receiving device. As is apparent from FIG. 12, the sensitivity reduces as the width of the p-type leakage prevention layer 307 increases.

Figure 13:
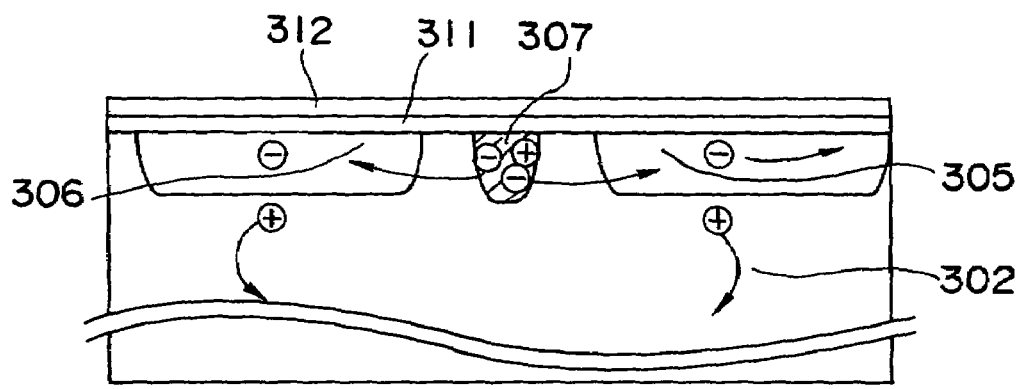
FIG. 13 is a view showing the movement of carriers of the above segmented type light-receiving device.

This is because light is absorbed in the vicinity of the device surface in the case of light that has a great absorption coefficient in the silicon substrate like short-wavelength light. Electrons and holes, which are generated by light applied to the cathode region at this time, flow toward the n-type diffusion layer and the substrate side. In contrast to this, electrons of the minority carriers among the carriers generated in the surface of the p-type diffusion layer 307 that serves as the leakage prevention layer, diffuse in the vicinity of the surface of the p-type leakage prevention layer 307 and reach the n-type diffusion layers 305 and 306 that serve as the cathodes as shown in FIG. 13. Therefore, when the concentration of the p-type leakage prevention layer 307 is high, the lifetime of the electrons that serve as the minority carriers is reduced, and therefore, the electrons come to contribute nothing to a photoelectric current. That is, this state occurs when the width of the region of the p-type leakage prevention layer 307 is greater than the diffusion length of the electrons that serve as the generated minority carriers. Consequently, the sensitivity in the p-type leakage prevention layer 307 is reduced.

Accordingly, as a result of measuring the sensitivity in this region by changing the width W1 [cm] and the surface concentration C1 [cm$^{-3}$] of the semiconductor layer of the p-type leakage prevention layer 307, it is preferable to form the p-type leakage prevention layer 307 so that the relation of:

$$C1 \leq 2.0\times10^{19}$$

is maintained when $W1<4\times10^{-5}$ cm and the relation of:

$$C1 \leq 1.0\times10^{20}\times\mathrm{Exp}(-4\times10^4\times W1)$$

is maintained when $W1 \geq 4\times10^{-5}$ cm. With the above arrangement, the reduction in the sensitivity of the p-type leakage prevention layer 307 is prevented.

In the dielectric films (311, 312) of the two-layer structure of the nitride film and the oxide film, it is preferable to set the film thickness of the nitride film to 40 nm and set the film thickness of the oxide film to 10 nm in order to restrain the reflectance to, for example, 2.5%. In this case, the concentration of the p-type leakage prevention layer 307 is required to be set to $1\times10^{18}$ cm$^{-3}$ or more. That is, in order to set the sensitivity in the region of this p-type leakage prevention layer 307 equal to that of the n-type diffusion layers 305 and 306 that serve as the cathode sections, the width W1 of the p-type leakage prevention layer 307 is required to be set to 11.5 μm or less.

The p-type leakage prevention layer 307 may have any construction. Furthermore, since the surface concentration and the width of the p-type leakage prevention layer contribute only to the sensitivity, there may be provided, for example, a structure in which a p-type diffusion layer is provided under the p-type leakage prevention layer as shown in FIG. 14.

Figure 14:
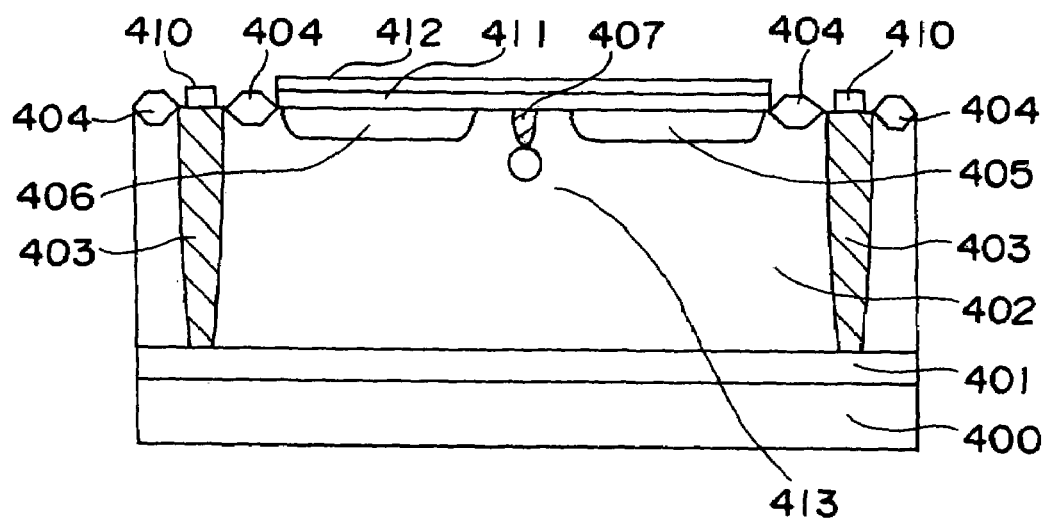
FIG. 14 is a sectional view of a segmented type light-receiving device of a structure in which a p-type semiconductor layer is provided under a p-type semiconductor film for leakage prevention.

That is, as shown in FIG. 14, a first p-type semiconductor layer 401 and a second p-type semiconductor layer 402 are successively formed on a p-type semiconductor substrate 400, and a third p-type semiconductor layer 403 for anode contact formation is formed downwardly from the surface of the second p-type semiconductor layer 402. A LOCOS region 404 for element isolation is formed on the surface of the second p-type semiconductor layer 402. Further, n-type diffusion layers 405 and 406 are formed on the surface of the second p-type semiconductor layer 402, and a cathode electrode (not shown) for current take out is provided on each of the n-type diffusion layers 405 and 406. A p-type leakage prevention layer 407 for preventing the leakage is formed in the region located between the n-type diffusion layers 405 and 406. Further, a dielectric film (oxide film) 411 and a dielectric film (nitride film) 412, which serve as an antireflection film, are formed at least in the region to which light is applied on the second p-type semiconductor layer 402. Further, an anode electrode 410 is formed on the third p-type semiconductor layer 403. Moreover, a p-type semiconductor layer 413 is formed under the p-type leakage prevention layer 407. This p-type semiconductor layer 413 is allowed to have various concentrations and structures adopted.

FIFTH EMBODIMENT

Figure 15:
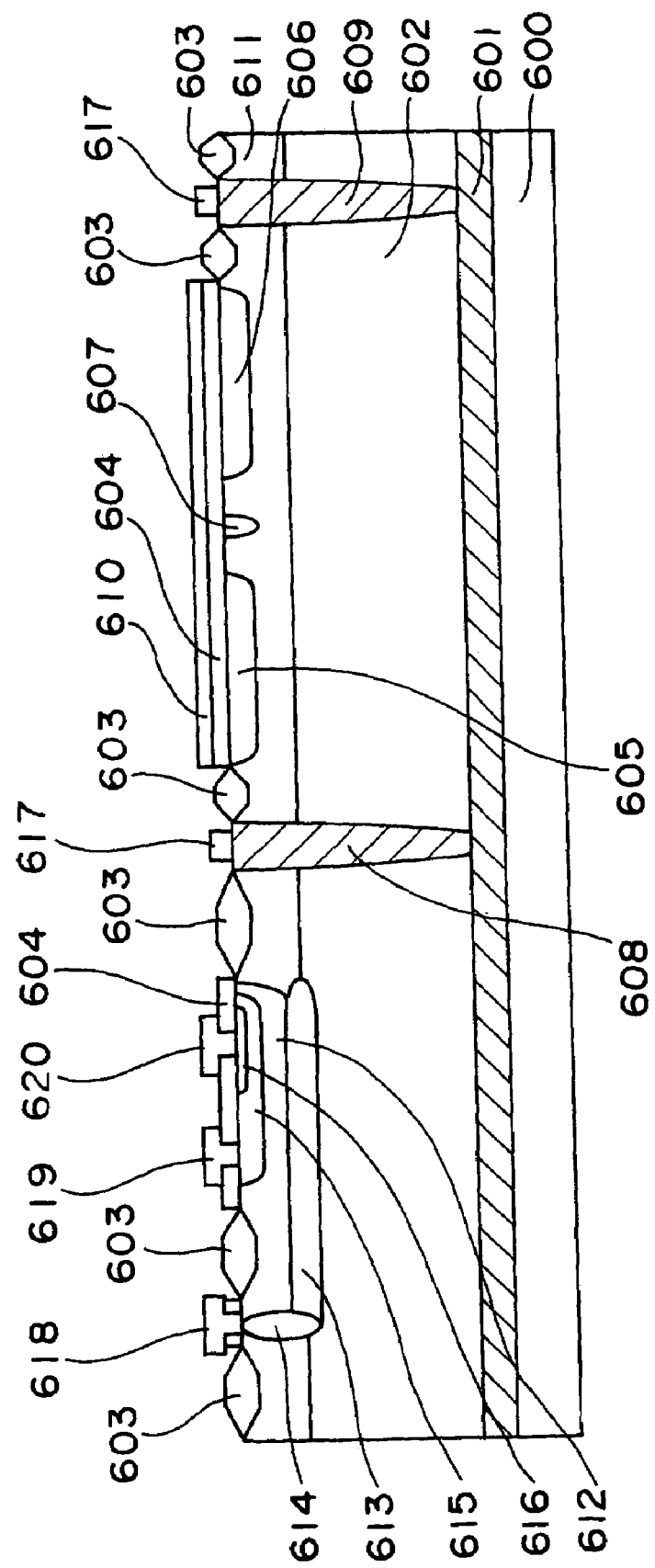
FIG. 15 is a sectional view of a circuit-integrated type light-receiving device of a fifth embodiment of this invention.

FIG. 15 is a sectional view showing the structure of the circuit-integrated type light-receiving device of the fifth embodiment of this invention. In this circuit-integrated type light-receiving device, a segmented type light-receiving device and, for example, a bipolar transistor for processing a signal obtained from the segmented type light-receiving device are formed on an identical semiconductor substrate. In the circuit-integrated type light-receiving device of this fifth embodiment, the structure (for example, multilayer interconnections, interlayer films and so on) formed subsequent to the metal interconnection processing step is not shown.

As shown in FIG. 15, a first p-type semiconductor layer 601 that has a thickness of 1 to 2 μm and a boron concentration of about $1\times10^{18}$ to $1\times10^{19}$ cm$^{-3}$ is formed on a p-type semiconductor substrate 600 (for example, silicon substrate) that has a boron concentration of about $1\times10^{15}$ cm$^{-3}$ in order to reduce a parasitic resistance generated at the anode of the segmented type light-receiving device, and a second p-type semiconductor layer 602 that has a film thickness of 15 to 16 μm and a boron concentration of about $1\times10^{13}$ to $1\times10^{14}$ cm$^{-3}$ is formed. An n-type semiconductor layer that serves as a collector 613 of an npn transistor is formed on the second p-type semiconductor layer 602. Then, a fourth p-type semiconductor layer 611 that has a film thickness of 1 to 2 μm and a boron concentration of about $1\times10^{13}$ to $1\times10^{14}$ cm$^{-3}$ is formed on this second p-type semiconductor layer 602. Further, A LOCOS regions 603 for element isolation is formed on the fourth p-type semiconductor layer 611.

Further, a plurality of n-type diffusion layers 605 and 606 as second conductive type first diffusion layers that have, for example, a phosphorus concentration of about $1\times10^{19}$ to $1\times10^{20}$ cm$^{-3}$ and a junction depth of 0.3 to 0.8 μm and a p-type leakage prevention layer 607 as a first conductive type second diffusion layer that has, for example, a boron concentration of $1\times10^{18}$ and a width of 2 μm is formed in the regions of the plurality of n-type diffusion layers 605 and 606 on the fourth p-type semiconductor layer 611. Even when the fourth p-type semiconductor layer 611 that forms a pn junction is made to have a high resistivity, by virtue of the p-type leakage prevention layer 607, it is possible to prevent the conductive type of the surface of this p-type semiconductor layer from being inverted by the positive charges at the antireflection film interface and prevent the n-type diffusion layers 605 and 606 from being electrically connected together.

Moreover, a dielectric film (oxide film) 604 and a dielectric film (nitride film) 610, which serve as an antireflection film, are formed at least in the region to which light is applied on the fourth p-type semiconductor layer 611. Further, in order to form metal interconnections of the first p-type semiconductor layer 601 on the substrate surface, third p-type semiconductor layers 608 and 609 that have a boron concentration of about $1\times10^{18}$ to $1\times10^{19}$ cm$^{-3}$ are formed.

Further, an n-type well structure 612 that has, for example, a phosphorus concentration of $2\times10^{15}$ to $2\times10^{16}$ cm$^{-3}$ is formed in the fourth p-type semiconductor layer 611 that serves as a transistor region. An n-type diffusion layer, which has, for example, a phosphorus concentration of $1\times10^{19}$ to $2\times10^{19}$ cm$^{-3}$ and serves as a collector contact 614 of the transistor, is formed in one region of the n-type well structure 612. Then, a p-type diffusion layer, which has, for example, a boron concentration of $1\times10^{17}$ to $2\times10^{17}$ cm$^{-3}$ and serves as the base 615 of the transistor is formed in one region of the n-type well structure 612, and an n-type diffusion layer that serves as an emitter 616 is formed by solid phase diffusion from the polysilicon in which arsenic is implanted. Then, a cathode electrode (not shown) and an anode electrode 617 of this segmented type light-receiving device as well as a collector electrode 618, a base electrode 619 and an emitter electrode 620 of the transistor are formed. A circuit-integrated type light-receiving device of satisfactory characteristics can be obtained with the segmented type light-receiving device as described above.

Although the structure of the segmented sections of the segmented type light-receiving device in the circuit-integrated type light-receiving device of this fifth embodiment is the one described in connection with the second embodiment, there may be employed the one described in any other embodiment. Moreover, although the npn-type transistor is employed, there may be a structure that employs a pnp-type transistor or both of the structures.

Moreover, the structure of the transistor and so on is not limited to the one described in connection with this fifth embodiment, and a variety of structures can be employed.

SIXTH EMBODIMENT

Figure 16:
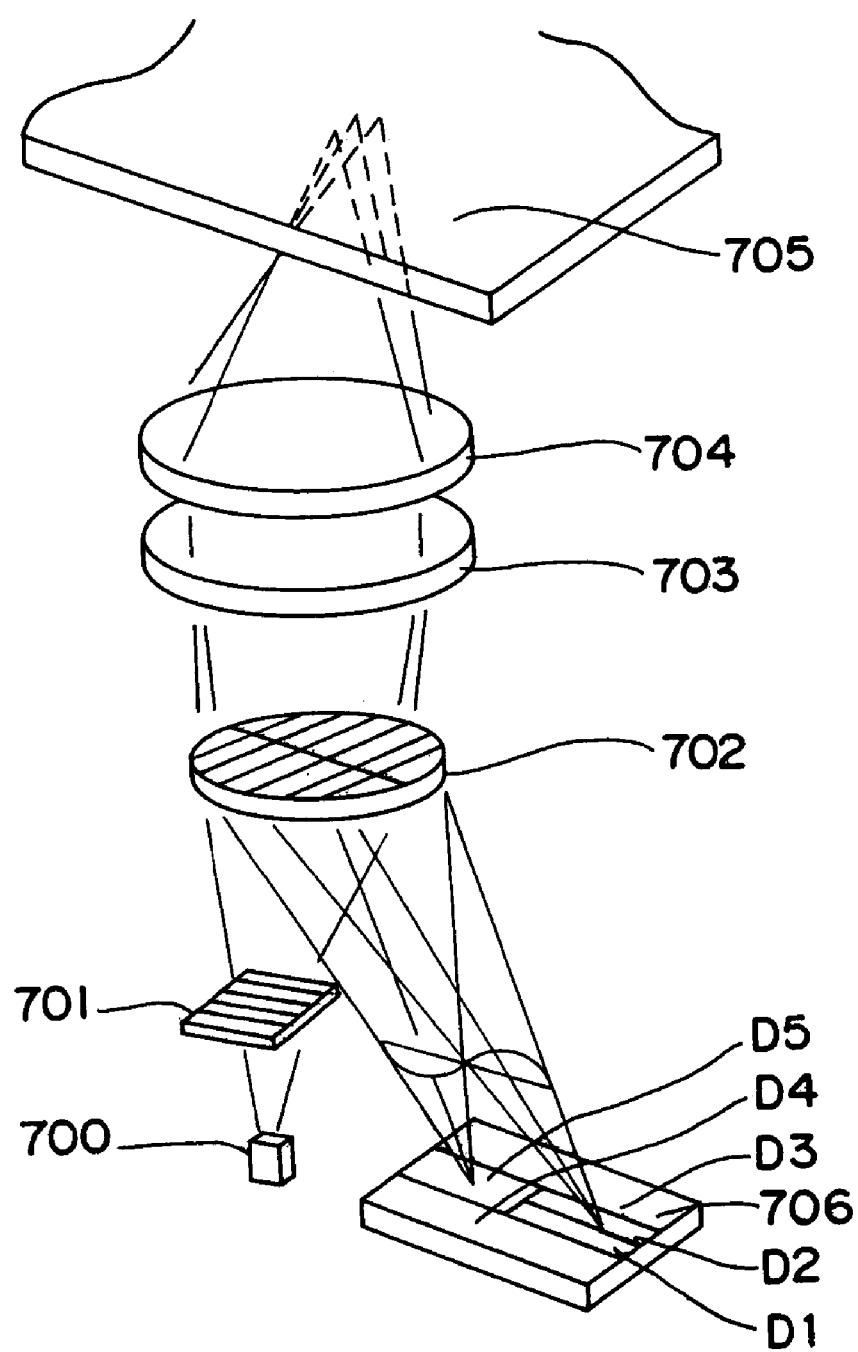
FIG. 16 is a schematic view showing the construction of the optical pickup section of an optical disk apparatus that employs the segmented type light-receiving device of a sixth embodiment of this invention.

FIG. 16 shows a schematic view showing the construction of the optical pickup section of an optical disk apparatus that employs the segmented type light-receiving device of the sixth embodiment of this invention.

As shown in FIG. 16, light emitted from a semiconductor laser 700 is split into three light beams of two side beams for tracking and a main beam for signal reading by a diffraction grating 701 for generating a tracking beam. Then, these light beams are transmitted as zeroth-order light beams through a hologram device 702, transformed into parallel light beams by a collimator lens 703 and thereafter concentrated on a disk surface 705 by an object lens 704. This concentrated light has its optical intensity modulated by pits formed on the disk surface 705 and is reflected, transmitted through the object lens 704 and the collimator lens 703 and thereafter diffracted by the hologram device 702. This first-order light component is made incident on a segmented type light-receiving device 706 constructed of five segmented light-receiving sections D1 through D5. Then, by adding and subtracting outputs from the five segmented light-receiving sections D1 through D5, a signal for signal reading and a signal for tracking can be obtained. It is acceptable to employ a circuit-integrated type light-receiving device with a segmented type light-receiving device in place of the segmented type light-receiving device.

By employing the segmented type light-receiving device of this invention for the optical disk apparatus that has the optical pickup section as described above, a high-speed high-density optical disk apparatus corresponding to a short wavelength can be obtained.

It is possible to unlimitedly adopt the structure of the segmented type light-receiving device of this invention and the circuit-integrated type light-receiving device that employs it not only for the segmented type light-receiving device that has the light-receiving surface described in connection with the sixth embodiment but also for those which have at least a pn junction to which a plurality of light rays are applied.

Moreover, the segmented type light-receiving device and the circuit-integrated type light-receiving device of this invention can be unlimitedly applied not only to the optical system of the sixth embodiment but also to various optical systems and optical disk apparatuses constructed of an optical pickup section that employ the

SEVENTH EMBODIMENT

Figure 17:
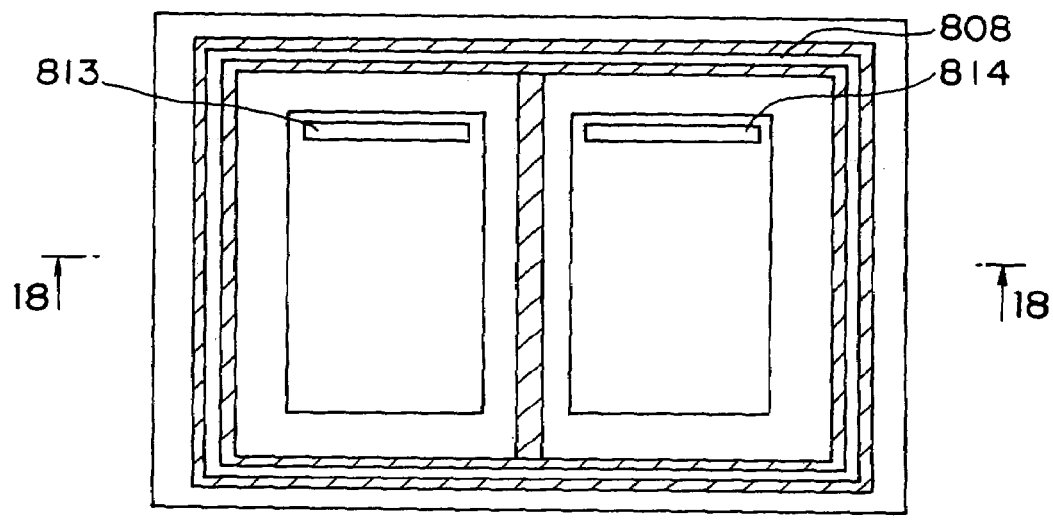
FIG. 17 is a plan view showing the planar structure of a segmented type light-receiving device of a seventh embodiment of this invention.
Figure 18:
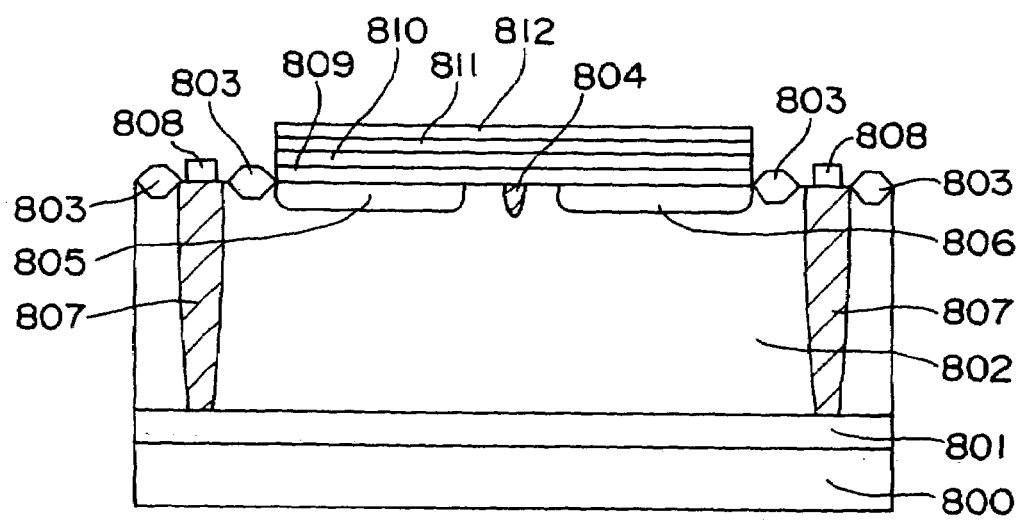
FIG. 18 is a sectional view taken along the line 18—18 of FIG. 17.

FIG. 17 is a plan view showing the planar structure of the segmented type light-receiving device of the seventh embodiment of this invention, and FIG. 18 is a sectional view taken along the line 18—18 of FIG. 17. In the segmented type light-receiving device of this seventh embodiment, the structure (for example, multilayer interconnections, interlayer films and so on) formed subsequent to the metal interconnection processing step is not shown.

As shown in FIGS. 17 and 18, a first p-type semiconductor layer 801 that has a thickness of 1 μm and a boron concentration of $1 \times 10^{18}$ cm$^{-3}$ is formed on a p-type semiconductor substrate 800 (for example, silicon substrate) that has a boron concentration of $1 \times 10^{15}$ cm$^{-3}$. A second p-type semiconductor layer 802 that has, for example, a thickness of 14 to 16 μm and a boron concentration of about $1 \times 10^{14}$ to $1 \times 10^{15}$ cm$^{-3}$ is formed on the first p-type semiconductor layer 801. A third p-type semiconductor layer 807 for anode contact is formed downwardly from the surface of the thus formed second p-type semiconductor layer 802. A LOCOS region 803 for element isolation is formed on the surface of the second p-type semiconductor layer 802.

Further, n-type diffusion layers 805 and 806 as second conductive type first diffusion layers that have, for example, an arsenic concentration of about $1 \times 10^{19}$ to $1 \times 10^{20}$ cm$^{-3}$ and a junction depth of about 0.1 μm to 0.8 μm are formed spaced apart at prescribed intervals on the surface of the second p-type semiconductor layer 802. Cathode electrodes 813 and 814 for current take out are provided on the n-type diffusion layers 805 and 806, respectively. Then, a p-type leakage prevention layer 804 as a first conductive type second diffusion layer for preventing leakage is provided in a region located between the n-type diffusion layers 805 and 806.

Further, a dielectric film (for example, silicon oxide film) 809, a dielectric film (for example, silicon nitride film) 810, a dielectric film (for example, silicon oxide film) 811 and a dielectric film (for example, silicon nitride film) 812, which serve as an antireflection film, are formed to have a four-layer structure at least in the region to which light is applied on the second p-type semiconductor layer 802. Further, an anode electrode 808 is formed on the third p-type semiconductor layer 807.

With the above-mentioned structure, no leakage occurs in the portion on the surface of which the second p-type semiconductor layer 802 is exposed since the n-type diffusion layers 805 and 806 are not connected together by virtue of the p-type leakage prevention layer 804 even when inversion is caused by an electric field due to, for example, electric charges injected from the surface into the four-layer dielectric films (809 through 812). Therefore, the device reliably functions as a segmented type light-receiving device.

Effects obtained by an antireflection film that has a structure of four or more layers of oxide films and nitride films will be described more in detail below.

FIG. 7 shows the calculation results of the reflectance dependency of a two-layer antireflection film constructed of a silicon oxide film and a silicon nitride film with respect to film thickness. It can be understood from FIG. 7 that the reflectance of the two-layer antireflection film can be reduced as the silicon oxide film thickness is reduced and the silicon nitride film thickness is increased. For example, in the case where the silicon oxide film thickness is 10 nm and the silicon nitride film thickness is 40 nm, the reflectance can be reduced down to 2.5%.

Moreover, FIG. 8 shows the relation of leakage current with respect to the surface concentration of the leakage prevention layer and the silicon oxide film thickness. As is apparent from FIG. 8, it can be understood that the surface concentration of the leakage prevention layer must be increased as the silicon oxide film thickness is reduced in order to prevent the inversion in the semiconductor surface.

Further, when the leakage prevention layer has a width required by the crosstalk characteristic of the segmented sections according to FIG. 12, there occurs a problem that the sensitivity of the leakage prevention layer cannot be obtained when the concentration of the leakage prevention layer is increased.

Figure 19:
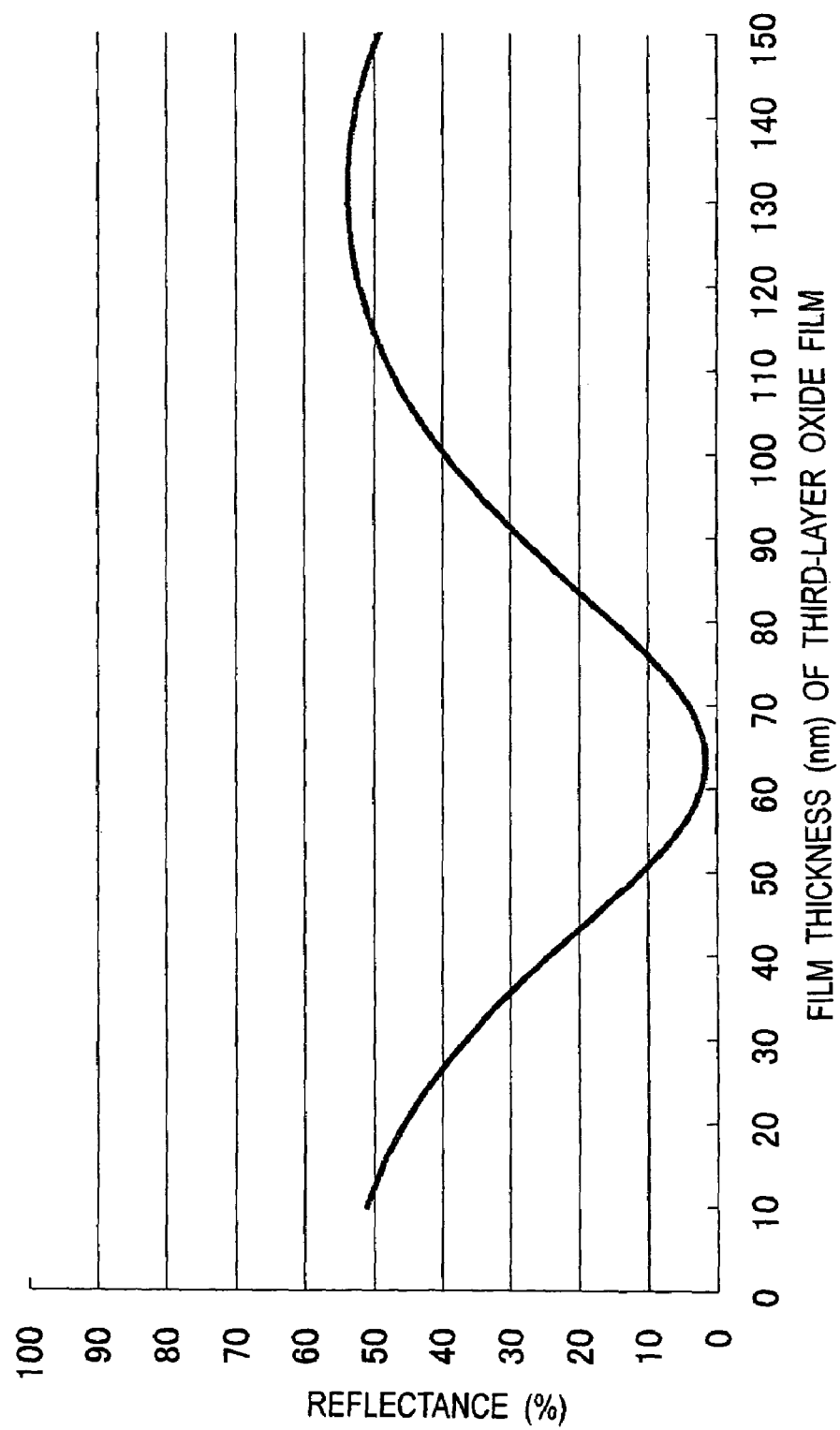
FIG. 19 is a graph showing the calculation result of reflectance with respect to a silicon oxide film of a third layer of a four-layer antireflection film.
Figure 20:
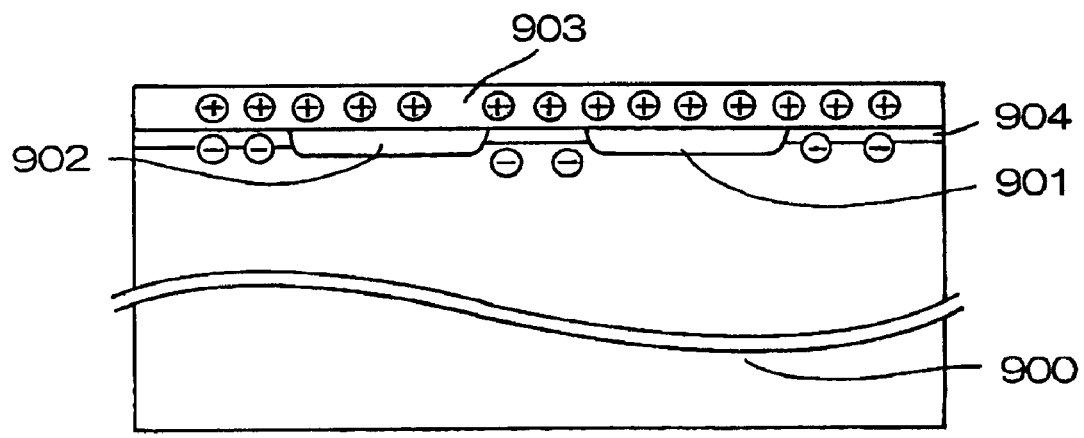
FIG. 20 is a sectional view showing the structure of a conventional segmented type light-receiving device.

In contrast to this, FIG. 19 shows the calculation result of reflectance (at a wavelength of 400 nm) with respect to the third-layer silicon oxide film of the four-layer antireflection film when, for example, the first-layer silicon oxide film is formed to a thickness of about 20 nm, the second-layer silicon nitride film is formed to a thickness of about 30 nm and the third-layer silicon nitride film and the fourth-layer silicon nitride film are formed to a thickness of about 50 nm successively on the second p-type semiconductor layer 802. By setting the thickness of the third-layer silicon nitride film to about 66 nm, it is possible to increase the thickness of the first-layer silicon oxide film and reduce the reflectance to about 2.1%.

As a result, even when the segmented sections have a width required by the crosstalk characteristic of the segmented sections, it is possible to reduce the reflectance and reduce the surface concentration of the leakage prevention layer. Therefore, the sensitivity can be kept satisfactory.

Although the four-layer antireflection film is formed in this seventh embodiment, a similar effect can be obtained even if the antireflection film is formed of a plurality of layers. For example, by setting the first-layer silicon oxide film to a thickness of about 20 nm, setting the second-layer silicon nitride film to a thickness of about 30 nm, setting the third-layer silicon oxide film to a thickness of about 66 nm, setting the fourth-layer silicon nitride film to a thickness of about 50 nm and setting the fifth-layer silicon oxide film to a thickness of about 70 nm, the reflectance can be adjusted to about 1.8%.

It is to be noted that the film thickness of the first-layer silicon oxide film is not limited to 20 nm but allowed to have various values. In the above case, by properly adjusting the thickness of each of the other films that constitute the antireflection film, the reflectance can be restrained.

EIGHTH EMBODIMENT

The segmented type light-receiving device of the eighth embodiment of this invention will be described next. This eighth embodiment has a device structure in which the conductive types are inverted with respect to the structure of FIGS. 17 and 18 in a manner that the n-type is inverted to the p-type and the p-type is inverted to the n-type. Therefore, although the anode electrode and the cathode electrode and the conductive types are inverted, this eighth embodiment will be described using the same reference numerals correspondingly referring to FIGS. 17 and 18.

A first n-type semiconductor layer 801 that has a thickness of 1 μm and a phosphorus concentration of $1 \times 10^{18} cm^{-3}$ is formed on an n-type semiconductor substrate 800 (for example, silicon substrate) that has a phosphorus concentration of $1 \times 10^{15}$ cm$^{-3}$. A second n-type semiconductor layer 802 that has, for example, a thickness of 14 to 16 μm and a phosphorus concentration of about $1 \times 10^{14}$ to $1 \times 10^{15}$ cm$^{-3}$ is formed on the first n-type semiconductor layer 801. A third n-type semiconductor layer 807 for anode contact is formed downwardly from the surface of the thus formed second n-type semiconductor layer 802. A LOCOS region 803 for element isolation is formed on the surface of the second n-type semiconductor layer 802.

Further, p-type diffusion layers 805 and 806 as second conductive type first diffusion layers that have, for example, a boron concentration of about $1 \times 10^{19}$ to $1 \times 10^{20}$ cm$^{-3}$ and a junction depth of about 0.1 μm to 0.8 μm are formed spaced apart at prescribed intervals on the surface of the second n-type semiconductor layer 802. Anode electrodes 813 and 814 for current take out are provided on the p-type diffusion layers 805 and 806, respectively. Then, an n-type leakage prevention layer 804 as a first conductive type second diffusion layer that employs phosphorus for preventing leakage is formed in the region located between the p-type diffusion layers 805 and 806.

Further, a dielectric film (for example, silicon oxide film) 809, a dielectric film (for example, silicon nitride film) 810, a dielectric film (for example, silicon oxide film) 811 and a dielectric film (for example, silicon nitride film) 812, which serve as an antireflection film, are formed to have a four-layer structure at least in the region to which light is applied on the second n-type semiconductor layer 802. Further, a cathode electrode 808 is formed on the third n-type semiconductor layer 807.

Even with the above-mentioned structure, the p-type diffusion layers 805 and 806 are not connected together by virtue of the n-type leakage prevention layer 804 in the portion on the surface of which the second n-type semiconductor layer 802 is exposed even when inversion is caused by electric charges due to the dielectric films of the antireflection film, and the device reliably functions as a segmented type light-receiving device.

Moreover, although the four-layer antireflection film is described in connection with this eighth embodiment, the present embodiment is not limited to this but allowed to be an antireflection film of a plurality of layers.

Moreover, arsenic or the like can be employed for n-type doping.

Moreover, the segmented type light-receiving device of this invention, which has a satisfactory characteristic with respect to light of a short wavelength and has sensitivity to light of the wavelengths of red, infrared and similar rays (the absorption coefficient is small, and photocarriers are generated in a comparatively deep region of the device), can therefore be applied also to optical disk apparatuses for multi-wavelength read and write.

In the segmented type light-receiving device of this invention, it is acceptable to provide a resin film that has optical transparency on the dielectric film formed at least in the region on which light is incident on the semiconductor layer.

The invention claimed is:

1. A segmented type light-receiving device comprising:
    a plurality of light receiving sections, which include second conductive type diffusion layers connected to their respective electrode for current takeout formed spaced apart at prescribed intervals on a first conductive type semiconductor layer so that;
    a first conductive type leakage prevention layer is formed at least between the plurality of second conductive type diffusion layers on the first conductive type semiconductor layer so as to prevent leakage between the plurality of second conductive type diffusion layers; and
    a dielectric film is formed at least on a region including the plurality of second conductive type diffusion layers and the leakage prevention layer on which light is incident.

2. The segmented type light-receiving device as claimed in claim 1, wherein
    the first conductive type semiconductor layer is exposed between the plurality of second conductive type diffusion layers and the first conductive type leakage prevention layer.

3. The segmented type light-receiving device as claimed in claim 1, wherein,
    assuming that the dielectric film has a film thickness d1 [nm] and the leakage prevention layer has a surface concentration C1 [cm$^{-3}$], then the film thickness d1 of the dielectric film and the surface concentration C1 of the leakage prevention layer are set so as to satisfy the condition of:

$$d1 \times \infty \sqrt{C1} \times 10^{10}.$$

4. The segmented type light-receiving device as claimed in claim 1, wherein,
    assuming that the leakage prevention layer has a width W1 [cm] and the leakage prevention layer has a surface concentration C1 [cm$^{-3}$], then the width W1 and the surface concentration C1 of the leakage prevention layer are set so as to satisfy the condition of:

$$C1 \leq 2.0 \times 10^{19}$$

when W1 < 4 × 10$^{-5}$ cm and satisfy the condition of:

$$C1 \geq 1.0 \times 10^{20} \times Exp(-4 \times 10^4 \times W1)$$

when W1 ≤ 4 × 10$^{-5}$ cm.

5. The segmented type light-receiving device as claimed in claim 1, wherein
    the dielectric film is comprised of a structure in which one or a plurality of oxide films and one or a plurality of nitride films are alternately laminated, the films totally constituting at least three layers.

6. A circuit-integrated type light-receiving device, wherein the segmented type light-receiving device claimed in claim 1 and a signal processing circuit for processing a signal outputted from the segmented type light-receiving device are formed on an identical semiconductor substrate.

7. An optical disk apparatus employing the circuit-integrated type light-receiving device claimed in claim 6.

8. An optical disk apparatus employing the segmented type light-receiving device as claimed in claim 1.

9. A segmented type light-receiving device comprising:
a plurality of light receiving sections, which include second conductive type first diffusion layers formed spaced apart at prescribed intervals on a first conductive type semiconductor layer so that;
a first conductive type second diffusion layer is formed at least between the plurality of second conductive type first diffusion layers on the first conductive type semiconductor layer;
a dielectric film is formed at least on a region including the plurality of second conductive type second diffusion layer on which light is incident, and
the plurality of second conductive type first diffusion layers and the first conductive type second diffusion layer have a layer thickness equal to or greater than an absorption length of short-wavelength light.

10. The segmented type of light-receiving device as claimed in claim 9, wherein
the first conductive type semiconductor layer is exposed between the plurality of second conductive type first diffusion layers and the first conductive type second diffusion layer.

11. The segmented type light-receiving device as claimed in claim 9, wherein,
assuming that the dielectric film has a film thickness d2 [nm] and the first conductive type second diffusion layer has a surface concentration C2 [cm$^{-3}$], then the film thickness d2 of the dielectric film and the surface concentration C2 of the first conductive type second diffusion layer are set so as to satisfy the condition of:

$$d1 \times \sqrt{C2} \geq 1 \times 10^{10}.$$

assuming that the dielectric film has a film thickness d2 [nm] and the first conductive type second diffusion layer has a surface concentration C2 [cm$^{-3}$], then the film thickness d2 of the dielectric film and the surface concentration C2 of the first conductive type second diffusion layer are set so as to satisfy the condition of:

$$d1 \times \sqrt{C2} \geq 1 \times 10^{10}.$$

12. The segmented type light-receiving device as claimed in claim 9, wherein,
assuming that the first conductive type second diffusion layer has a width W2 [cm] and the first conductive type second diffusion layer has a surface concentration C2 [cm$^{-3}$], then the width W2 and the surface concentration C2 of the second diffusion layer are set so as to satisfy the condition of:

$$C2 \leq 2.0 \times 10^{19}$$

when W2 < 4×10$^{-5}$ cm and satisfy the condition of:

$$C2 \geq 1.0 \times 10^{20} \times \mathrm{Exp}(-4 \times 10^4 \times W2)$$

W2 ≤ 4×10$^{-5}$ cm.

* * * * *